(12) United States Patent  (10) Patent No.: US 7,637,272 B2
Cho et al.  (45) Date of Patent: Dec. 29, 2009

(54) METHOD AND APPARATUS FOR CLEANING AND DRYING SUBSTRATES

(75) Inventors: Jung-Keun Cho, Seoul (KR);
Chang-Ro Yoon, Osan-si (KR);
Kyo-Woog Koo, Cheonan-si (KR)

(73) Assignee: Semes Co., Ltd., Chonan-Si, Chungcheongnam-do (KR)

( * ) Notice: Subject to any disclaimer, the term of this patent is extended or adjusted under 35 U.S.C. 154(b) by 162 days.

(21) Appl. No.: 11/433,403

(22) Filed: May 15, 2006

(65) Prior Publication Data

US 2006/0266386 A1 Nov. 30, 2006

(30) Foreign Application Priority Data

May 26, 2005 (KR) ...................... 10-2005-0044474

(51) Int. Cl.
*B08B 3/00* (2006.01)
(52) U.S. Cl. ..................................... 134/95.2
(58) Field of Classification Search ................. 134/95.2
See application file for complete search history.

(56) References Cited

U.S. PATENT DOCUMENTS

| 4,432,406 | A | * | 2/1984 | Belanger et al. ............. 160/199 |
| 6,158,449 | A | * | 12/2000 | Kamikawa .................... 134/61 |
| 6,394,110 | B2 | * | 5/2002 | Kamikawa et al. ............. 134/61 |
| 6,575,178 | B1 | | 6/2003 | Kamikawa |
| 6,586,171 | B1 | | 7/2003 | Iwado |
| 2002/0104206 | A1 | * | 8/2002 | Hirano ....................... 29/25.02 |
| 2002/0121435 | A1 | * | 9/2002 | Volodarsky et al. ..... 204/224 R |
| 2004/0060194 | A1 | | 4/2004 | Kawahara |
| 2005/0039776 | A1 | | 2/2005 | Yi et al. |
| 2005/0091871 | A1 | * | 5/2005 | Yi et al. ........................ 34/275 |
| 2006/0237033 | A1 | * | 10/2006 | Yi et al. ........................ 134/2 |

FOREIGN PATENT DOCUMENTS

CN 1185027 A 6/1998

(Continued)

OTHER PUBLICATIONS

Notice to File a Response/Amendment to the Examination Report and English translation thereof for corresponding Korean Application No. 10-205-0044474, dated Apr. 27, 2006.

*Primary Examiner*—Frankie L Stinson
*Assistant Examiner*—Samuel A Waldbaum
(74) *Attorney, Agent, or Firm*—Harness, Dickey & Pierce (57) ABSTRACT

The present invention provides an apparatus and method for cleaning substrates such as semiconductor wafers by sinking the substrates into cleaning fluids such as cleaning chemicals or rinsing liquids and then drying the substrates. The substrate clean and dry apparatus of present invention includes a process chamber comprising a cleaning chamber that carries the cleaning fluid and discharges at bottom the cleaning fluid; and a drying chamber above the cleaning chamber. The process chamber further includes a discharge device for evacuating the gas from the drying chamber, the gas supplied into the drying chamber. The discharge device is located between the cleaning chamber and the drying chamber, and evacuates the gas by force such that the gas is driven down vertically in the drying chamber. The substrate clean and dry apparatus of the present invention generates fairly vertical and uniform gas flows over the surfaces of substrates in the drying chamber, and also evacuates the gas rapidly from the drying chamber, thereby enhancing efficiency of the drying process.

13 Claims, 9 Drawing Sheets

FOREIGN PATENT DOCUMENTS

| | | |
|---|---|---|
| JP | 6-35584 | 5/1994 |
| JP | 10-154689 | 6/1998 |
| JP | 11-040535 | 2/1999 |
| JP | 2003-033737 | 2/2003 |
| JP | 2004-363440 | 12/2004 |
| JP | 2005-030682 | 2/2005 |
| JP | 2005-064501 | 3/2005 |
| JP | 2005-081257 | 3/2005 |
| JP | 2005-103386 | 4/2005 |
| KR | 1998-081033 | 11/1998 |
| KR | 10-0236411 | 12/1999 |
| TW | 523822 | 3/2003 |
| TW | 569324 | 1/2004 |
| TW | 200515473 | 5/2005 |
| WO | WO 2005/004217 | 1/2005 |

* cited by examiner

METHOD AND APPARATUS FOR CLEANING AND DRYING SUBSTRATES

PRIORITY CLAIM

A claim of priority is made under 35 U.S.C. § 119 to Korean Patent Application 10-2005-0044474 filed on May 26, 2005, the entire contents of which are hereby incorporated by reference.

BACKGROUND

1. Field of the Invention

The present invention relates to an apparatus for cleaning and drying substrates. More particularly, the present invention relates to an apparatus and method for cleaning substrates such as semiconductor wafers and LCD glass panels by sinking the substrates into cleaning fluids and then drying the substrates.

2. Discussion of the Related Art

A substrate cleaning method that is widely adopted in semiconductor manufacturing processes includes sinking the substrates such as semiconductor wafers and LCD glass panels into treatment tanks consecutively. The treatment tanks are filled with cleaning fluids such as cleaning chemicals or rinsing liquids.

After the wafers being treated for cleaning as above, a drying process generally follows for removing or drying water on the wafer surface. In well known drying method, vapors of volatile organic chemical such as isopropyl alcohol are provided toward the substrate such that the vapors, being condensed and deposited on the surface of the substrate, remove waters thereon, hence drying the substrate.

An apparatus for cleaning and drying substrates has been disclosed in Korea publication patent 1999-7018 wherein two chambers, a cleaning chamber and a drying chamber, were integrated into a single chamber, the drying chamber being positioned above the cleaning chamber, such that both the cleaning and drying process could be carried out in the single chamber.

The cleaning and drying apparatus has discharge openings on fixed locations, on both of the lower sides of the drying chamber, the discharge openings for evacuating the inert gas and volatile organic chemical from the drying chamber. With the discharge openings formed on both sides of the drying chamber, flow irregularity arouses: the gas flow diverges toward each discharge opening near the bottom of the drying chamber, and accordingly the gas flow becomes weaker at the center region. Due to the flow irregularity, it takes longer time to evacuate the inert gas and volatile organic chemical from the drying chamber, and hence the efficiency of the drying process deteriorates. In addition, the pressure of the drying chamber being higher than that of the cleaning chamber (the pressure of the drying chamber and the cleaning chamber are different from each other), it is hard to induce a strong gas flow along the surfaces of the substrates.

SUMMARY OF THE INVENTION

The present invention provides an apparatus for cleaning and drying substrates. The substrate clean and dry apparatus of present invention includes a cleaning chamber for carrying and discharging from a bottom a cleaning fluid; a drying chamber that is located above the cleaning chamber; a transfer device for transferring substrate between the cleaning chamber and the drying chamber; a gas supplier that is located in the drying chamber, the gas supplier for a gas to dry the wafers transferred to the drying chamber; and a discharge device that is located between the cleaning chamber and the drying chamber, the discharge device for evacuating the gas forcibly from the drying chamber such that the gas is vertically driven down in the drying chamber.

According to one aspect of the present invention, the discharge device of the cleaning and drying apparatus includes a discharge block that that includes a plurality of discharge holes on its top surface; and internal passages that are connected to the discharge holes.

The discharge device may include two separable discharge blocks, a discharge block I and a discharge block II, which are symmetric with respect to each other. The discharge block I and the discharge block II, respectively, include a plurality of discharge holes on its top surface; and internal passages that are connected to the discharge holes.

According to another aspect of the present invention, the cleaning and drying apparatus further includes an actuator for locating the discharge block I and II at a discharge position or at a standby position. When the discharge blocks are at the discharge positions, the gas is forcibly evacuated from the dry chamber so that the gas is vertically driven down in the drying chamber. When the discharge blocks are at the standby position, the substrates are transferred between the cleaning chamber and the drying chamber.

In one aspect of the present invention, the actuator of the cleaning and drying apparatus includes a slider for sliding the discharge block I, II horizontally in an opposite direction, that is, away from each other. Here, the drying chamber further includes standby rooms on both of the lower sides of the drying chamber. The standby rooms are where the discharge block I and the discharge block II stay for the standby position, after they are slid by the slider.

In another aspect of the present invention, the actuator includes an elevator for lifting or lowering a first end of the discharge block I, II, the first end that is closer to the sidewall of the drying chamber; and a horizontal guider for moving horizontally a second end of the discharge block I, II, while the first end of the discharge block I, II that is closer to the sidewall of the discharge block I, II is lifted up or lowered by the elevator. In this way, within a narrow space of the drying chamber, the discharge block I, II can be changed from a horizontal position to a nearly vertical position close to a sidewall of the drying chamber, and vice versa.

In still another aspect of the present invention, the discharge block I, II can be rotated about one of its end by the actuator.

According to one aspect of the present invention, the discharge block I and the discharge block II are positioned to be separated from each other so that the pressure is kept same at the cleaning chamber and the drying chamber.

In one aspect of the present invention, the discharge device further includes discharge lines, each of which connected to each of the internal passages through the sidewall; a vacuum pump, installed on the discharge lines; and a controller for controlling the vacuum pump so as to control the pressure of the cleaning chamber and the drying chamber.

The present invention also provides a method for drying wafers. The drying method of the present invention includes a step for moving the wafers to the drying chamber, after the wafers are cleaned; and a step for drying the wafers by supplying a gas in the drying chamber. Here, the step for drying the wafers includes a step for placing the discharge block I and discharge block II below the wafers, before the dry gas is supplied to the wafers; and a step for supplying the gas through the top of the drying chamber such that the gas flows down to dry the wafers, and simultaneously evacuating the gas forcibly through the discharge block I, II at the bottom of the drying chamber.

In the step for drying the wafers, the gas is supplied toward the wafers through a plurality of inject nozzles which are formed on the top of the drying chamber, and the gas is discharged through discharge holes that are formed on the top surface of the discharge block I, II. Here, the discharge block I, II are positioned below the substrate, facing toward the inject nozzles. The gas is evacuated forcibly from the drying chamber at the discharge block I, II such that the drying occurs at pressure lower than that of the atmosphere.

According to one aspect of the present invention, in the step for drying the wafers, the discharge block I and the discharge block II are positioned to be separated from each other, so the pressure is kept same at the cleaning chamber and the drying chamber.

According to one aspect of the present invention, in the step for drying the wafers, the pressure of the drying chamber may be controlled. In this case, the pressure is measured at inside of the drying chamber, and the vacuum pump connected to the discharge block I, II is manipulated according to the measured pressure, such that the pressure of the inside of the drying chamber is controlled.

BRIEF DESCRIPTION OF THE DRAWINGS

The above and other advantages of the present invention will become readily apparent by reference to the following detailed description when considered in conjunction with accompanying drawings wherein.

DESCRIPTION OF THE EMBODIMENTS

Hereinafter, the embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
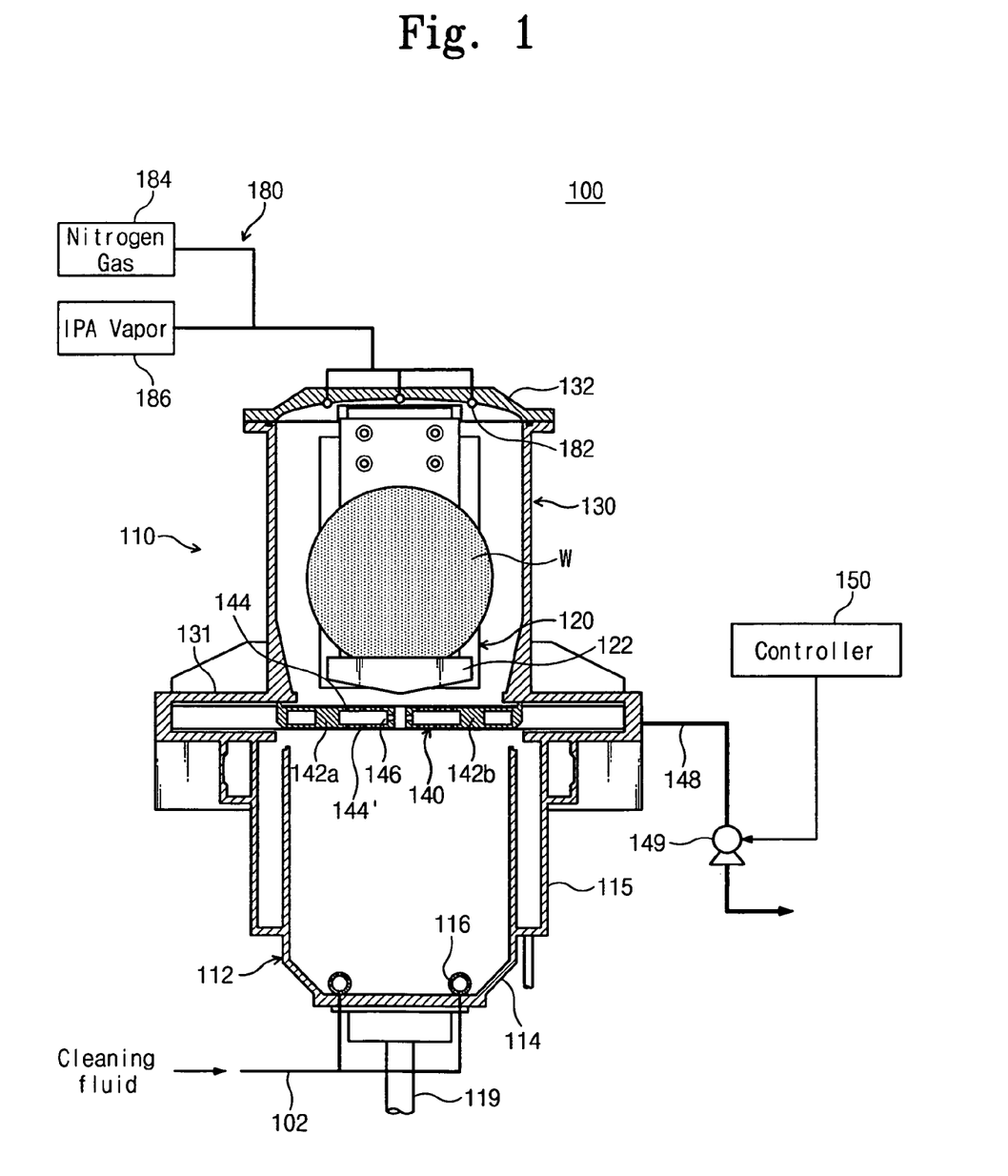
FIG. 1 is a sectional view illustrating a substrate clean and dry apparatus according to an exemplary embodiment of the present invention.
Figure 2:
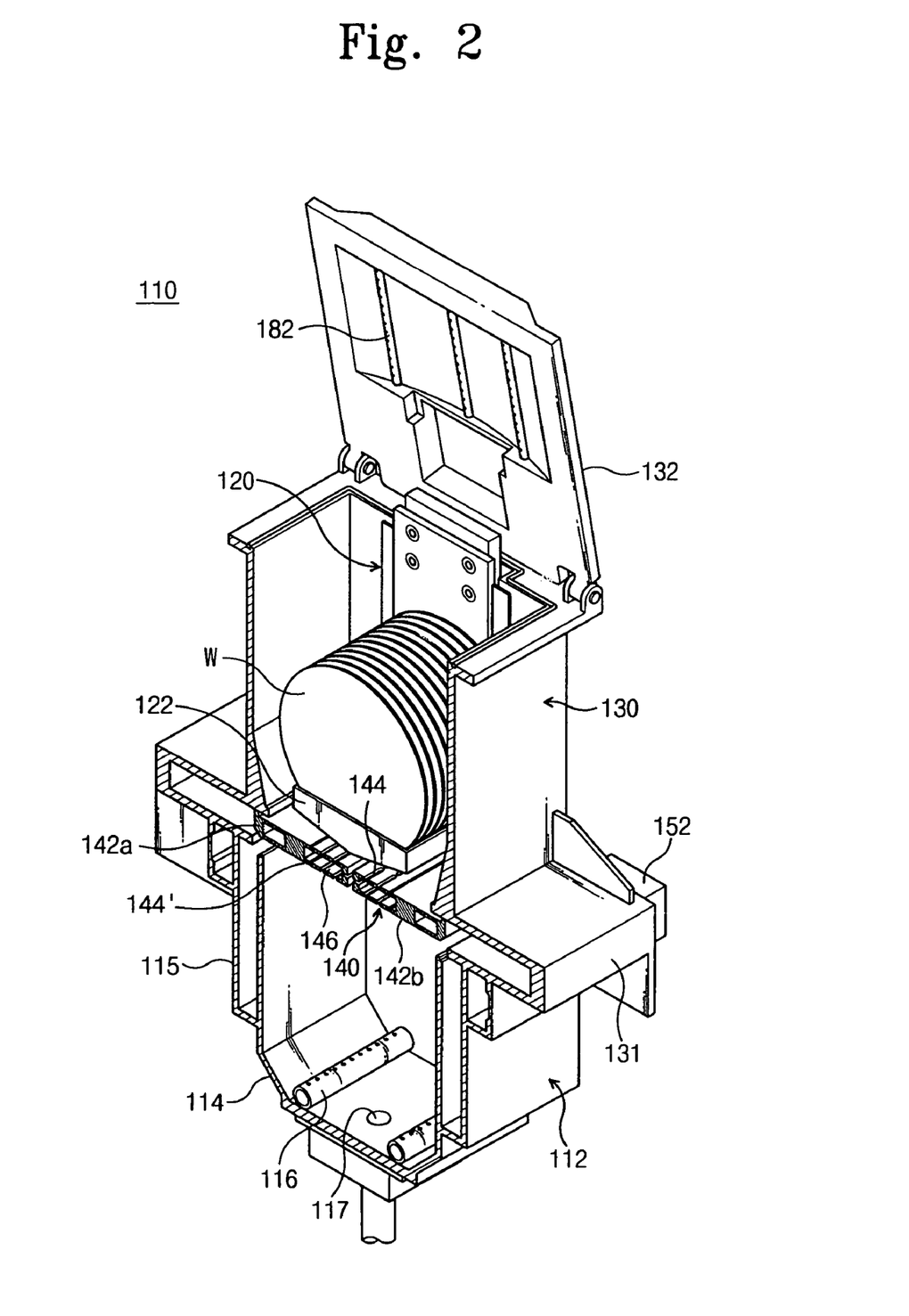
FIG. 2 is a perspective view illustrating a process chamber of FIG. 1.

Referring FIGS. 1 and 2, a substrate clean and dry apparatus 100 of the present invention includes a process chamber 110. In the process chamber 110, a cleaning process and a drying process are carried out for substrates. The process chamber 110 includes a cleaning chamber 112 where the cleaning process is carried out for substrates; a drying chamber 130, located above the cleaning chamber 130, where the drying process is carried out; a transfer device for transferring substrate between the cleaning chamber 112 and the drying chamber 130; and a discharge device 140.

The cleaning chamber 112 includes an inner container 114 for carrying cleaning fluids; and an outer container 115 for collecting the cleaning fluids overflowed from the inner container 114 during the cleaning process. The inner container 114 is open at its top. Nozzles 116 are provided on both sides of the bottom of the inner container 112, the nozzles 116 for supplying the cleaning fluids. A drainage hole 117 for discharging the cleaning fluids is formed on the center of the bottom of the inner container 114.

Examples of the cleaning fluids include HF; mixtures of HF and deionized water; mixtures of ammonia, H2O2, and deionized water; mixtures of HCl, H2O2, and deionized water; and mixtures of the former.

Figure 3A:
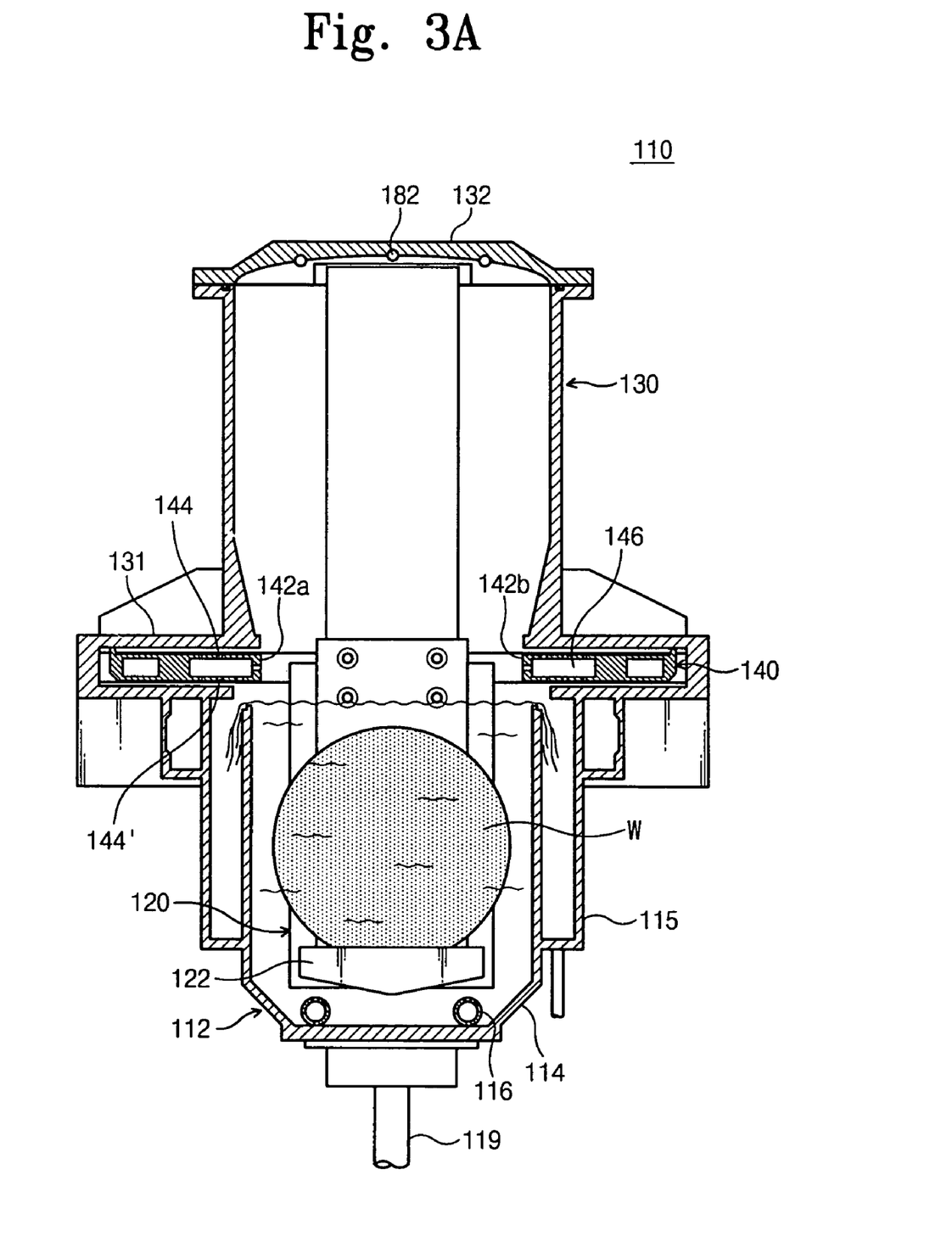
FIG. 3a is a sectional view illustrating wafers that are being cleaned in the process chamber.

Referring to FIG. 3a, a plurality of substrates W, being mounted on the substrate boat 122 of a transfer device 120, are placed within the inner container 114 of the cleaning chamber 112. Twenty-five or Fifty sheets of substrates W at a time stand vertically on the substrate boat 122. The substrate boat 122 is lifted up or lowered down by an elevator (not drawn) installed at outside of the process chamber 110. The cleaning fluids supplied from a cleaning fluid supply line 102 enter the inner container 114 through the nozzles 116. The cleaning fluids overflowed from the inner container 114 are collected at the outer container 115 and drained there. Drainage lines 119, after the cleaning process is carried out, are to discharge the cleaning fluids in slow or fast rate in order to take advantage of the Malangoni effects. Though not drawn here, the drainage lines 119 connected to the drainage hole 117 of the inner container 114 can include two types of drainage lines for fast and slow drainage.

The drying chamber 130 has a movable cover 132 on its top. A gas supplier 180 is to supply nitrogen gas and dry gas to the drying chamber 130. The gas supplier 180 includes inject nozzles 182 through which the nitrogen gas and dry gas are injected toward the substrates, the substrates transferred from the cleaning chamber 110 after the cleaning process; and nitrogen gas reservoir 184 and dry gas reservoir 186 which are connected to the inject nozzles 182. Mixtures of inert gas and isopropyl alcohol (IPA) vapor can be used for the dry gas.

Referring to FIGS. 1 and 2, the discharge device 140 is positioned below the drying chamber 130 (and above the cleaning chamber 112). The discharge device 140 is to evacuate forcibly the nitrogen gas and the dry gas from the drying chamber, so the gas flows down uniformly within the drying chamber 130. Since the gas is taken away from the drying chamber 130 by force, the drying process is carried out below the atmospheric pressure, and the dry gas flows nearly straight down to the bottom of the drying chamber. That accelerates evaporations from the substrate surfaces, hence enhancing efficiency of the drying process.

Figure 4A:
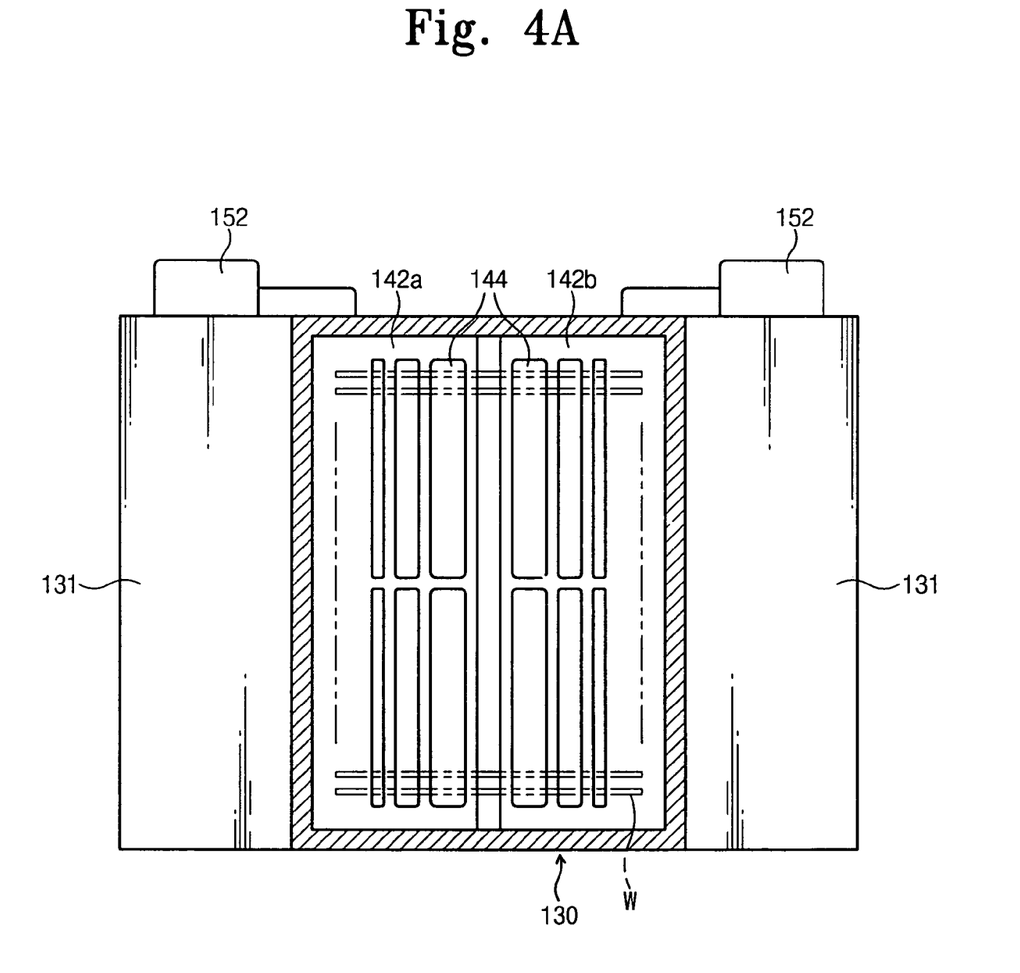
FIG. 4a and FIG. 4b are sectional views illustrating discharge positions of a discharge block I and a discharge block II.
Figure 4B:
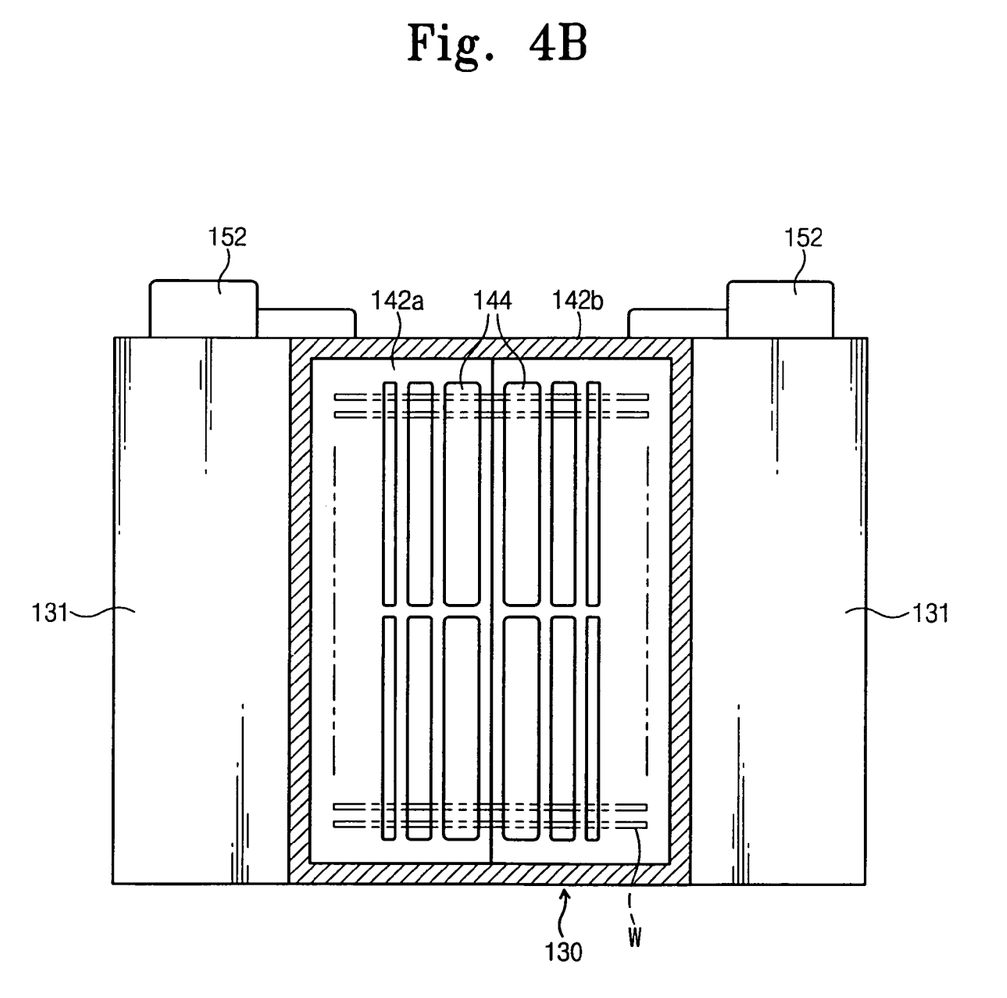

Referring to FIGS. 2 and 4a, the discharge device 140 includes a discharge block I 142a; a discharge block II 142b; and an actuator 152 for moving each discharge block. The discharge block I 142a and the discharge block II 142b are installed symmetrically with respect to each other, and can be slid horizontally to be separated from each other. The discharge blocks 142a, 142b have a form of box, the box including a plurality of discharge holes 144 on the top surface of the box; and internal passages 146 that are connected to the discharge holes 144. The internal passages 146 are connected to the outside discharge lines 148 (drawn in FIG. 1). A vacuum pump 149 is installed on the discharge line 148. The vacuum pump 149 is controlled by a controller 150. Size of the discharge holes 144 is largest at the center of the drying chamber 130 (i.e. the center of the substrates W) and decreases gradually toward the sides of the drying chamber 130. The discharge holes 144 are presented as slots here, but it can have other forms.

In addition, the discharge block I 142a and the discharge block II 142b include a plurality of discharge holes 144' on the side and bottom surfaces of the discharge blocks 142a, 142b. The discharge holes 144' are to keep the pressure of the drying chamber 130 same with that of the cleaning chamber 112. The gas in the cleaning chamber 112 can flow into the drying chamber 130, when the discharge holes 144 are formed only on the top surfaces of the discharge block I 142a and II 142b and the gas is forced to be discharged from the drying chamber 130. With the discharge holes 144' added on the side and bottom surfaces of the discharge blocks 142a, 142b, this kind of backflow from the cleaning chamber 112 to the drying chamber 130 can be prevented, the backflow being caused by instantaneous pressure changes at interfaces between the cleaning chamber 112 and the drying chamber 130.

In an embodiment of the present invention, when pressure changes abnormally in the cleaning chamber 112 or in the drying chamber 130, the controller 150 restores the pressure state back to normal by detecting the pressure change and controlling the vacuum pump 149 accordingly.

The actuator 152 of the discharge device 140 is installed at outside of the drying chamber 130. A hydraulic cylinder device can be used for the actuator 152, the actuator 152 for linearly translating the discharge block I and II. Any other type of device can be used such as a motor and lead-screw driver for translating linearly the discharge block I and II.

The discharge block I 142a and the discharge block II 142b can be placed either at a discharge position or at a standby position. The discharge block I and II are placed at the discharge positions, shown in FIG. 3b, when the gas is being evacuated from the drying chamber 130, so the gas is driven down vertically in the drying chamber 130. The discharge block I 142a and the discharge block II 142b stay at the standby position (FIG. 3a), when the substrates are being transferred between the cleaning chamber 112 and the drying chamber 130. The drying chamber 130 includes standby rooms 131 on both lower sides of the drying chamber 130. The standby rooms 131 are to take the discharge block I 142a and the discharge block II 142b for the standby position, when the discharge block I and II are slid to the standby rooms 131 by the actuator 152.

It is recommended that the discharge block I 142a and the discharge block II 142b be positioned separated in a distance from each other, as shown in FIG. 4a. With a gap between the discharge block I 142a and the discharge block II 142b, pressure is maintained same at the cleaning chamber 112 and the drying chamber 130 during the drying process. Needless to say, the cleaning chamber 112 and the drying chamber 130 can be disconnected by positioning the discharge block I and II to stick together, forming no gap between the discharge blocks.

The substrate clean and dry apparatus 100 of the present invention described as above supplies the nitrogen gas and inert gas from the top of the drying chamber 130 and evacuates the gas by force at the bottom of the drying chamber 130, so gas flows can be formed uniformly over the surfaces of substrates in the drying chamber, the gas evacuation time of the drying chamber can be reduced, accordingly the efficiency of the drying process increases.

Figure 5:
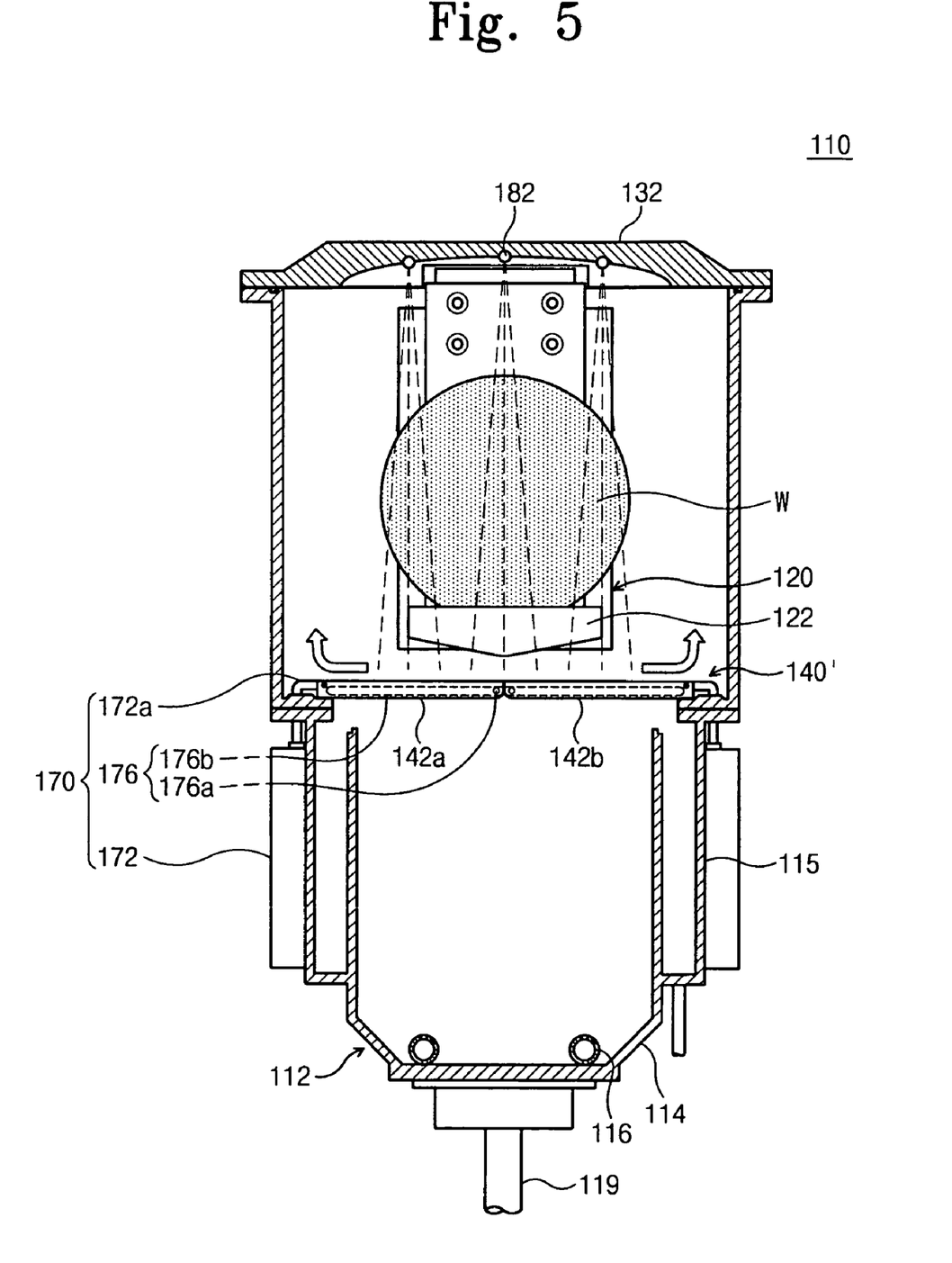
FIG. 5 and FIG. 6 are sectional views illustrating process chambers with different discharge device.
Figure 6:
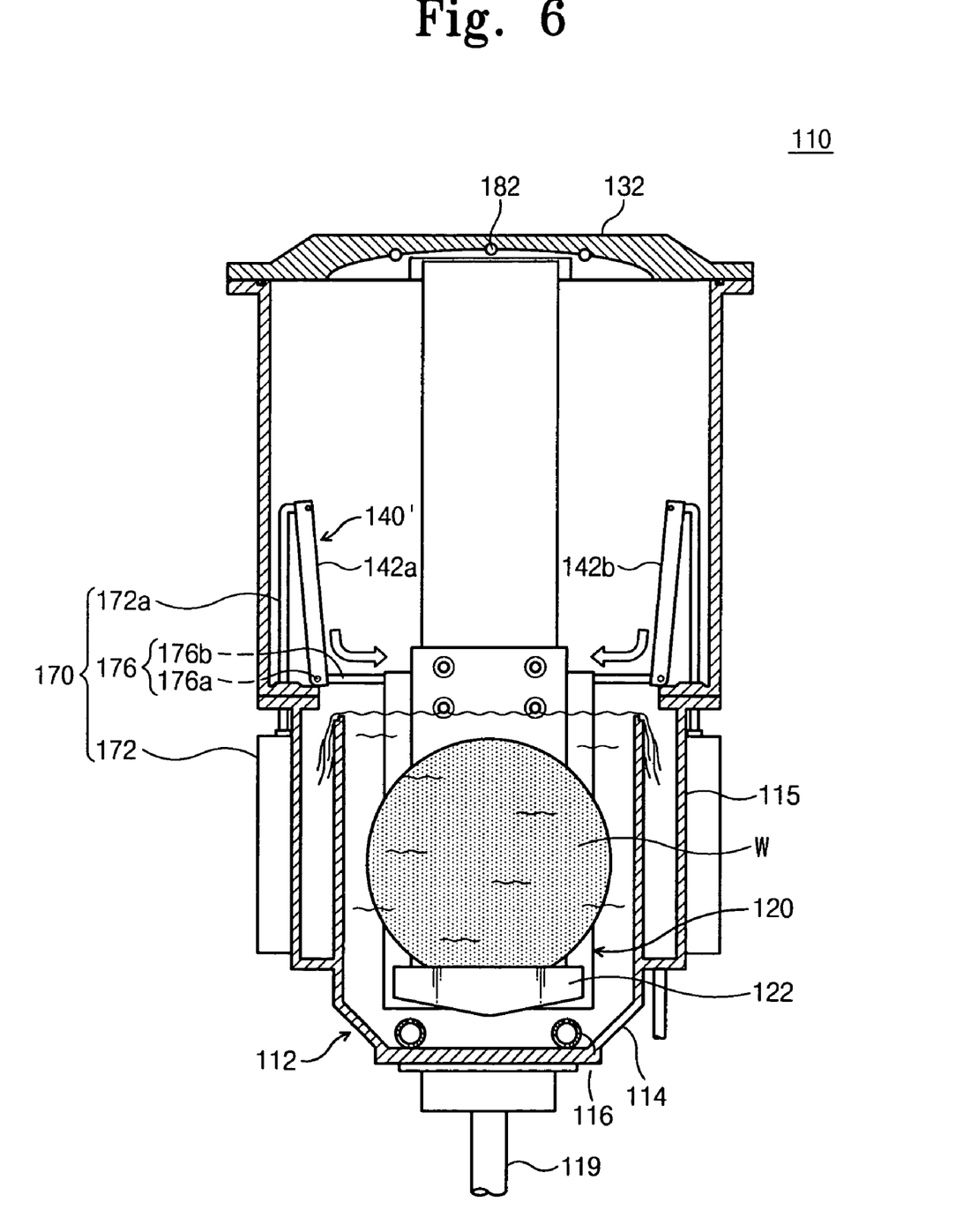

FIG. 5 and FIG. 6 are drawings illustrating the process chamber that includes a different discharge device.

Referring to FIG. 5 and FIG. 6, the discharge device 140' includes a discharge block I 142a; a discharge block II 142b; and an actuator 170 for moving each of the discharge blocks 142a, 142b. The discharge block I 142a and the discharge block II 142b, here have the same structure and function as described above, so no further explanation will be given about them. However, the move trajectories of the discharge block I 142a and the discharge block II 142b are different from those described above, in a way that the size of the process chamber 110 can be reduced.

Referring to FIG. 5 and FIG. 6, an actuator 170 moves the discharge block I 142a and the discharge block II 142b from a horizontal position to a nearly vertical position against a sidewall of the drying chamber and vice versa. The actuator 170 includes an elevator 172 including a hydraulic cylinder, the elevator 172 for lifting or lowering a first end of the discharge block I and II, the first end that is closer to the sidewall of the drying chamber 130; and a horizontal guider 176 for moving horizontally a second end of the discharge block I and II, the second end that is farther from the sidewall of the drying chamber 130. The second end of the discharge block I and II is moved by the horizontal guider 176, when the first end of the discharge block I and II is lifted or lowered by the elevator 172. The horizontal guider 176 includes a guide pin 176a formed on the side of the discharge block I and II; and a guide rail 176b for moving horizontally the guide pin 176a. The guide rail 176b is formed on a lower front or a lower back of the drying chamber 130. As a rod 172a of the hydraulic cylinder rises, one end of the discharge block I and II is lifted, and the other end of the discharge block I and II is pulled to move along the guide rail 176b, finally the discharge block I and II stand in a nearly vertical configuration, close to the sidewall of the drying chamber 130. Conversely, as the rod 172a of the hydraulic cylinder descends, the end of the discharge block I and II is lowered, so the other end of the discharge block I and II is pushed to move along the guide rail 176b, and finally the discharge block I and II is laid horizontally.

Within a narrow space of the drying chamber 130, the actuator 170 changes the discharge block I, II from a horizontal position to a nearly vertical position close to a sidewall of the drying chamber 130 and vice versa. Since the standby rooms are unnecessary here, the standby rooms extruded from the side of the drying chamber 130 can be removed, and the size of the process chamber can be reduced as much.

Figure 3B:
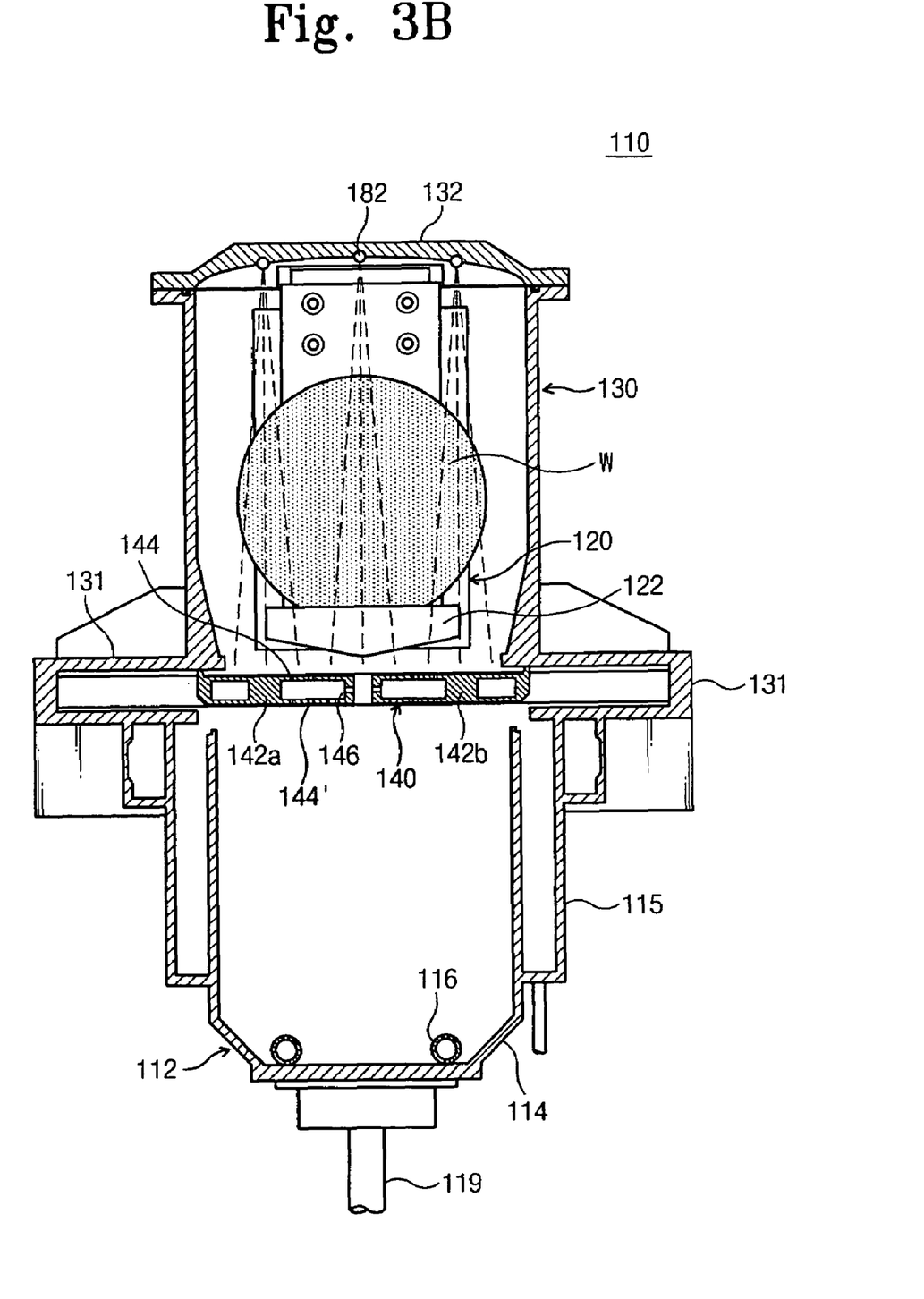
FIG. 3b is a sectional view illustrating wafers that are being dried in the process chamber.
Figure 7:
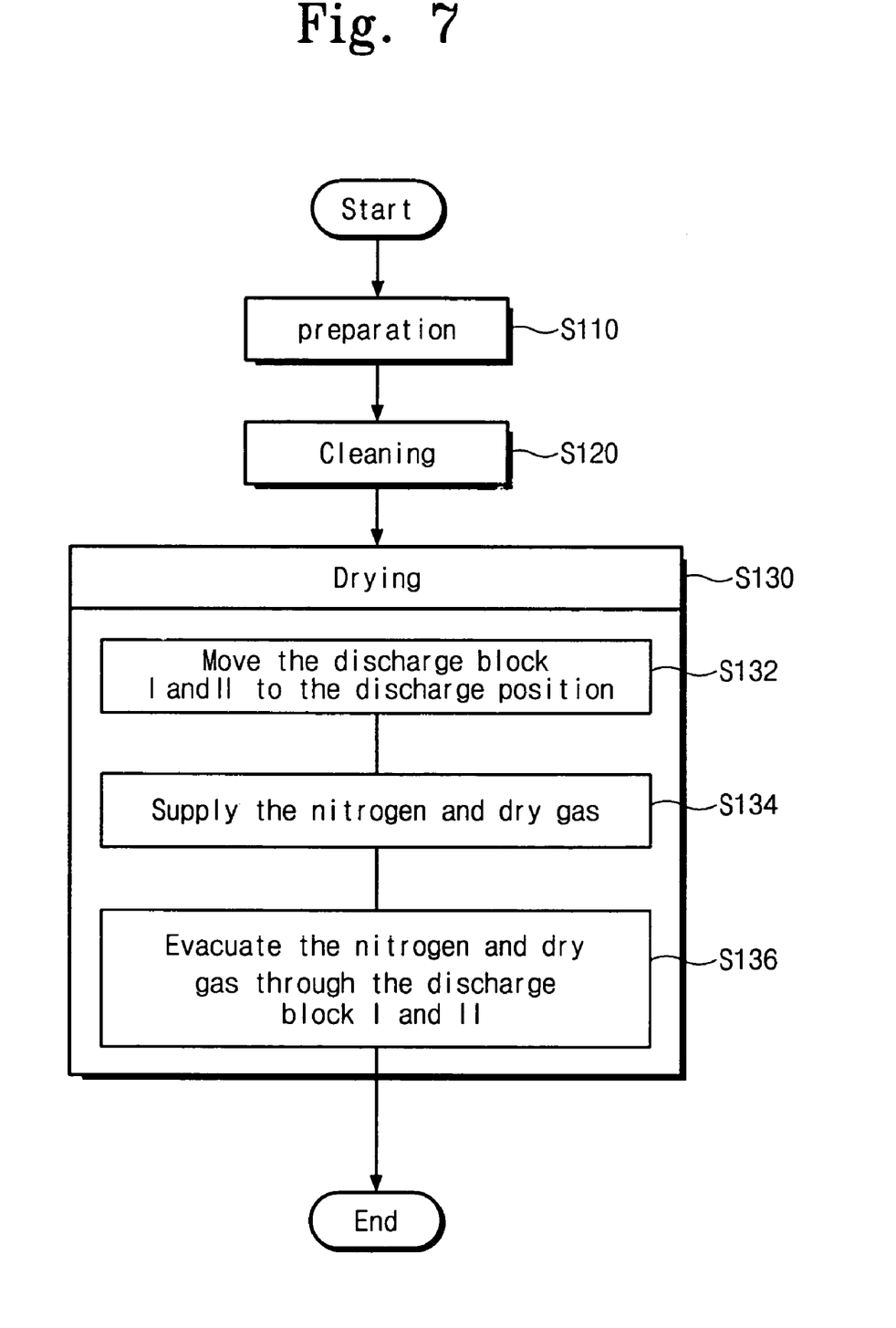
FIG. 7 is a flow chart illustrating a method for cleaning and drying substrates according to the present invention

Referring to FIG. 3a, FIG. 3b and FIG. 7, according to an embodiment of the present invention, a substrate clean and dry method includes a preparation step S110, a cleaning step S120, and a drying step S130.

The preparation step S110 for preparing a clean and dry process includes opening a cover 132 of the drying chamber 130; loading the substrates W; closing the cover 132, supplying the nitrogen gas, and supplying ultrapure water. The cleaning step S120 follows the preparation step S110. In the cleaning step S120, the cleaning fluids are continuously supplied to and simultaneously drained from the substrates W, and the cleaning fluids flowing over the surfaces of the substrates W remove contaminants from the substrates W. Refer to FIG. 3b for the cleaning process. After the cleaning process being finished, the substrates W are transferred to the drying chamber 130, and the drying step S130 starts. The discharge block I and II are moved to the discharge position below the substrates (step S132), before the gas is supplied for drying substrates. Then, the nitrogen and dry gas is supplied through inject nozzles on the top of the drying chamber 130 such that the gas flows vertically down toward the substrates in the drying chamber 130 (step S134). The nitrogen and dry gas, referring to FIG. 3b, is forcibly evacuated through the discharge block I and II at the bottom of the drying chamber 130

(step S136). In the drying step S130, the pressure is controlled at the drying chamber 130 for the drying process by manipulating the vacuum pump 149 according to pressure measurements at the inside of the drying chamber 130. In the drying step S130, the gas forms a uniform, nearly vertical flow over the surfaces of the substrates in the drying chamber 130, and the gas is evacuated rapidly from the drying chamber 130.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A substrate cleaning and drying apparatus comprising:
    a cleaning chamber carrying a process for cleaning substrates;
    a drying chamber carrying a process for drying the substrates, the drying chamber located above the cleaning chamber;
    a transfer device transferring the substrates between the cleaning chamber and the drying chamber;
    a gas supplier that is located in the drying chamber, the gas supplier for supplying a gas for drying the substrates and
    a discharge device that is located between the cleaning chamber and the drying chamber, the discharge device for evacuating forcibly the gas from the drying chamber such that the gas is driven down generally vertically in the drying chamber;
    wherein the discharge device comprising;
    a discharge block having a bottom surface, a top surface, a plurality of discharge holes that are formed on the top surface of the discharge block, at least one of the discharge holes extending through the top and bottom surfaces of the discharge block and at least one internal passage that are connected to the discharge holes;
    discharge lines connected to at least one internal passage through the sidewall; and
    a vacuum pump installed on the discharge lines.

2. The substrate cleaning and drying apparatus of claim 1, wherein a plurality of discharge holes are formed on a bottom surface of the discharge block and connected to at least one internal passages.

3. The substrate cleaning and drying apparatus of claim 1, wherein the discharge block comprises a discharge block I and a discharge block II, which are symmetric with respect to each other, wherein a plurality of discharge holes on a top surface of the discharge block I and the discharge block II and internal passages that are connected to the discharge holes.

4. The substrate cleaning and drying apparatus of claim 3, wherein a plurality of discharge holes are formed on a bottom and side surface of the discharge block I and the discharge block II.

5. The substrate cleaning and drying apparatus of claim 4, wherein the discharge device further comprises:
    a controller for controlling the vacuum pump so as to control the pressure of the cleaning chamber and the drying chamber.

6. The substrate cleaning and drying apparatus of claim 4, wherein size of the discharge hole is largest at the center of the drying chamber and decreases gradually toward the sides of the drying chamber.

7. The substrate cleaning and drying apparatus of claim 3, further comprising:
    an actuator for positioning the discharge block I and II at a discharge position or at a standby position, wherein the gas is forcibly evacuated from the drying chamber through the discharge device such that the gas is driven down vertically in the drying chamber when the discharge block is at the discharge position, and the substrates can be transferred between the cleaning chamber and the drying chamber when the discharge block I and II is at the standby position.

8. The substrate cleaning and drying apparatus of claim 7, wherein the actuator comprises a slider for sliding the discharge block I and II horizontally in an opposite direction, and the drying chamber further comprises standby rooms which are formed on both lower sides of the drying chamber, the standby rooms where the discharge block I and the discharge block II, after being slid by the slider, can stay in an standby position.

9. The substrate cleaning and drying apparatus of claim 7, wherein the actuator comprises:
    an elevator for lifting or lowering a first end of the discharge block I, II, the first end that is closer to the sidewall of the drying chamber; and
    a horizontal guider for guiding horizontal move of a second end of the discharge block I and II, while the first end of the discharge block I and II is lifted up or lowered by the elevator, whereby within a narrow space of the drying chamber the discharge block I and II can be changed from a horizontal position to a nearly vertical position close to a sidewall of the drying chamber and vice versa.

10. The substrate cleaning and drying apparatus of claim 7, wherein the discharge block I and II can be rotated about one end of the discharge block by the actuator.

11. The substrate cleaning and drying apparatus of claim 7, wherein the discharge block I and II are placed in a position separated from each other such that the pressure is kept same at the cleaning chamber and the drying chamber.

12. The substrate cleaning and dying apparatus of claim 1, further comprising:
    a plurality of internal passages and the internal passages are connected to more than one discharge hole.

13. The substrate cleaning and drying apparatus of claim 1, wherein the internal passage connects with multiple discharge holes.

* * * * *